(12) United States Patent
Shibayama

(10) Patent No.: US 7,768,626 B2
(45) Date of Patent: Aug. 3, 2010

(54) EXPOSURE APPARATUS

(75) Inventor: Takashi Shibayama, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/334,707

(22) Filed: Dec. 15, 2008

(65) Prior Publication Data

US 2009/0141259 A1 Jun. 4, 2009

Related U.S. Application Data

(63) Continuation of application No. 11/446,117, filed on Jun. 5, 2006.

(30) Foreign Application Priority Data

Jun. 7, 2005 (JP) ............................. 2005-167353

(51) Int. Cl.
*G03B 27/42* (2006.01)
(52) U.S. Cl. ......................................... 355/53; 355/72
(58) Field of Classification Search ................. 355/30, 355/53, 72
See application file for complete search history.

(56) References Cited

U.S. PATENT DOCUMENTS

| | | | | |
|---|---|---|---|---|
| 5,696,590 A | 12/1997 | Makita | ........................ | 356/399 |
| 5,699,145 A | 12/1997 | Makinouchi et al. | .......... | 355/53 |
| 5,812,396 A | 9/1998 | Kato | ....................... | 364/167.07 |
| 6,259,511 B1 | 7/2001 | Makinouchi et al. | .......... | 355/53 |
| 6,322,060 B1 | 11/2001 | Mayama et al. | ............. | 267/136 |
| 6,342,942 B1 | 1/2002 | Uzawa | | |
| 6,696,590 B2 | 2/2004 | Bonnard et al. | ............. | 558/280 |
| 6,816,232 B2 | 11/2004 | Takahashi et al. | ............. | 355/53 |
| 2002/0080339 A1* | 6/2002 | Takahashi | ..................... | 355/72 |
| 2004/0083966 A1 | 5/2004 | Takahashi et al. | ........... | 118/715 |
| 2004/0137384 A1 | 7/2004 | Hara | .......................... | 430/343 |
| 2007/0035713 A1 | 2/2007 | Shibayama | ................... | 355/72 |

FOREIGN PATENT DOCUMENTS

| | | |
|---|---|---|
| JP | 7-29801 | 1/1995 |
| JP | 8-241126 | 9/1996 |
| JP | 9-26828 | 1/1997 |
| JP | 10-256144 | 9/1998 |

\* cited by examiner

*Primary Examiner*—Edward J Glick
*Assistant Examiner*—Mesfin T Asfaw
(74) *Attorney, Agent, or Firm*—Fitzpatrick, Cella, Harper & Scinto

(57) ABSTRACT

An exposure apparatus, which forms a latent image pattern on a substrate using an exposure beam, includes a first structure which supports a projection unit which projects an exposure beam onto a substrate, a first supporting leg which includes a first actuator and supports the first structure, a first state detector which detects a state of the first structure, a second structure which supports a substrate stage which aligns the substrate, a second supporting leg which includes a second actuator and supports the second structure, a second state detector which detects a state of the second structure, and a control unit which controls, on the basis of a signal from the first state detector and a signal from the second state detector, the first actuator and the second actuator so as to synchronize the first structure and the second structure with each other.

3 Claims, 16 Drawing Sheets

EXPOSURE APPARATUS

This application is a continuation application of copending U.S. patent application Ser. No. 11/446,117, filed on Jun. 5, 2006.

This application also claims the benefit of Japanese Patent Application No. 2005-167353, filed on Jun. 7, 2005, which is hereby incorporated by reference herein in its entirety.

FIELD OF THE INVENTION

The present invention relates to an exposure apparatus which forms a latent image pattern on a substrate using an exposure beam.

BACKGROUND OF THE INVENTION

To attain stable micromachining, a precision apparatus, such as a semiconductor manufacturing apparatus, must be maximally insulated from vibration conducted from the external environment. Therefore, such a precision apparatus needs to be mounted on an anti-vibration apparatus. In particular, an anti-vibration apparatus in a semiconductor exposure apparatus is demanded to realize, with good balance, external vibration insulation performance, and performance to suppress internal vibration generated upon activating a substrate stage, because it continuously moves at a high speed.

In response to such a demand, recently, an active anti-vibration apparatus is being used. The active anti-vibration apparatus controls vibration by driving an actuator in accordance with a detection signal output from a vibration sensor. The active anti-vibration apparatus has both vibration insulation performance and vibration suppression performance.

Japanese Patent Laid-Open No. 10-256144 discloses a typical arrangement example of an anti-vibration apparatus. In Japanese Patent Laid-Open No. 10-256144, an acceleration sensor is used as a vibration sensor, which detects vibration of a base as a vibration removal target, and an air spring is used as an actuator which drives the base. The acceleration sensor is so installed as to align its detection axes along the horizontal and vertical directions, and to detect the accelerations of the base in the horizontal and vertical directions. The air spring supports the base so as to match its thrust generation axes with the horizontal and vertical directions, and to generate the base thrusts in the horizontal and vertical directions. The air spring is driven in accordance with compensation values obtained by appropriately compensating detection signals of the acceleration sensor in the horizontal and vertical directions. Executing such a so-called vibration feedback operation effectively suppresses vibration of the base.

In recent years, an exposure apparatus used to manufacture a semiconductor device, a liquid crystal panel, or a magnetic head is being improved by various methods to cope with demands for a higher speed and accuracy. In particular, to meet these demands, it is very important for a structure to be free of vibration. Either of structure vibration generated upon driving an original stage or a substrate stage, and that conducted from the installation floor, must be sufficiently reduced.

A scan exposure apparatus, which drives both an original and a substrate using stages, may adopt the following arrangement. That is, an original (or projection lens) and a substrate are mounted on separate structures to separately remove vibrations acting upon driving respective stages, and an active anti-vibration apparatus (a so-called active damper) supports the structures. Alternatively, three components, i.e., an original, a substrate, and a projection lens are mounted on separate structures, and an active damper supports the structures. Such an active damper is generally so controlled as to independently remove vibrations of a first structure having an original stage (or a projection lens) and a second structure having a substrate stage. Therefore, control of the relative positional relationship between the structures, i.e., the positional relationship between the original (or projection lens) and the substrate is often unsatisfactory, resulting in an exposure failure.

Conventionally, the positional relationship between a projection lens and a substrate is generally corrected by a substrate stage alone. The exposure accuracy of this structure greatly depends on the control performance of the substrate stage.

SUMMARY OF THE INVENTION

The present invention has been made in consideration of the above problems, and has as its object, e.g., to increase the exposure accuracy by controlling the relative positional relationship between a structure, which supports a substrate stage, and a structure, which supports a projection unit, which projects an exposure beam onto a substrate.

An exposure apparatus according to the present invention is configured to form a latent image pattern on a substrate using an exposure beam, and comprises a first structure, which supports a projection unit, which projects an exposure beam onto a substrate, a first anti-vibration supporting leg, which includes a first actuator and supports the first structure, a second structure, which supports a substrate stage, which aligns the substrate, a second anti-vibration supporting leg, which includes a second actuator and supports the second structure, and a control unit, which controls at least one of the first actuator and the second actuator to reduce a relative displacement between the first structure and the second structure.

According to a preferred embodiment of the present invention, the first actuator can so operate as to reduce vibration of the first structure. In this case, preferably, the exposure apparatus further comprises a state detector which detects the state of the first structure, and the control unit controls the first actuator on the basis of the state of the first structure. This makes it possible to cause the first anti-vibration supporting leg to function as an active anti-vibration apparatus. For example, floor vibration insulation performance and performance to suppress vibration generated by a supporting target of the first anti-vibration supporting leg improve.

Similarly, the second actuator can so operate as to reduce vibration of the second structure. In this case, preferably, the exposure apparatus further comprises a state detector which detects the state of the second structure, and the control unit controls the second actuator on the basis of the state of the second structure. This makes it possible to cause the second anti-vibration supporting leg to function as an active anti-vibration apparatus. For example, floor vibration insulation performance and performance to suppress vibration generated by a supporting target of the second anti-vibration supporting leg improve.

According to a preferred embodiment of the present invention, preferably, the projection unit includes an original stage which aligns an original, and a projection optical system which projects a pattern of the original onto the substrate using the exposure beam, the exposure apparatus further comprises a first stage state detector which detects a state of the original stage, and a first stage actuator which drives the original stage relative to the first structure, and the control unit drives the first stage actuator on the basis of the state of the original stage.

According to a preferred embodiment of the present invention, preferably, the exposure apparatus further comprises a second stage state detector which detects a state of the substrate stage, and a second stage actuator which drives the substrate stage relative to the second structure, and the control unit drives the second stage actuator on the basis of the state of the substrate stage.

According to a preferred embodiment of the present invention, preferably, the control unit synchronously drives the original stage and the substrate stage.

According to a preferred embodiment of the present invention, preferably, the exposure apparatus further comprises a relative displacement detector which detects the relative displacement between the first structure and the second structure, and the control unit controls, on the basis of information sent from the relative displacement detector, at least one of the first actuator and the second actuator to reduce the relative displacement between the first structure and the second structure.

According to a preferred embodiment of the present invention, the control unit can correct a driving signal of the second actuator on the basis of a control signal of the first actuator, and can correct a driving signal of the first actuator on the basis of a control signal of the second actuator, thereby reducing the relative displacement between the first structure and the second structure.

Alternatively, the control unit may correct a driving signal of the first actuator on the basis of a control signal of the second actuator, thereby allowing the first structure to follow the second structure.

Alternatively, the control unit may correct a driving signal of the second actuator on the basis of a control signal of the first actuator, thereby allowing the second structure to follow the first structure.

According to a preferred embodiment of the present invention, the control unit can control both the first actuator and the second actuator on the basis of the information sent from the relative displacement detector, thereby reducing the relative displacement between the first structure and the second structure.

Alternatively, the control unit may control the first actuator on the basis of the information sent from the relative displacement detector, thereby allowing the first structure to follow the second structure.

Alternatively, the control unit may control the second actuator on the basis of the information sent from the relative displacement detector, thereby allowing the second structure to follow the first structure.

The present invention makes it possible to, e.g., increase the exposure accuracy by controlling the relative positional relationship between a structure which supports a substrate stage and a structure which supports a projection unit, which projects an exposure beam onto a substrate.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described below with reference to the accompanying drawings.

First Embodiment

Figure 6:
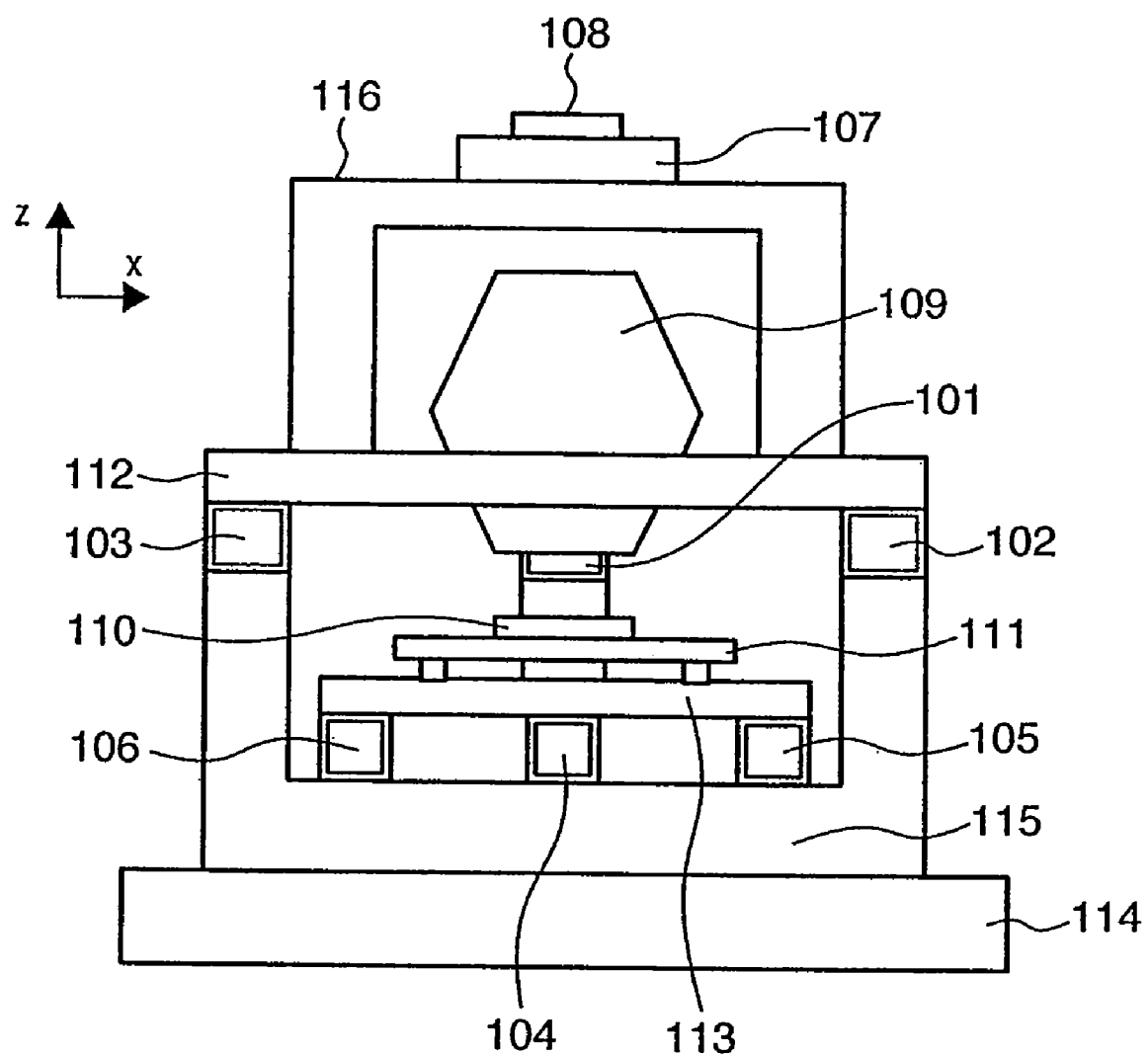
FIG. 6 is a front view showing an exposure apparatus according to the preferred embodiment of the present invention.
Figure 7:
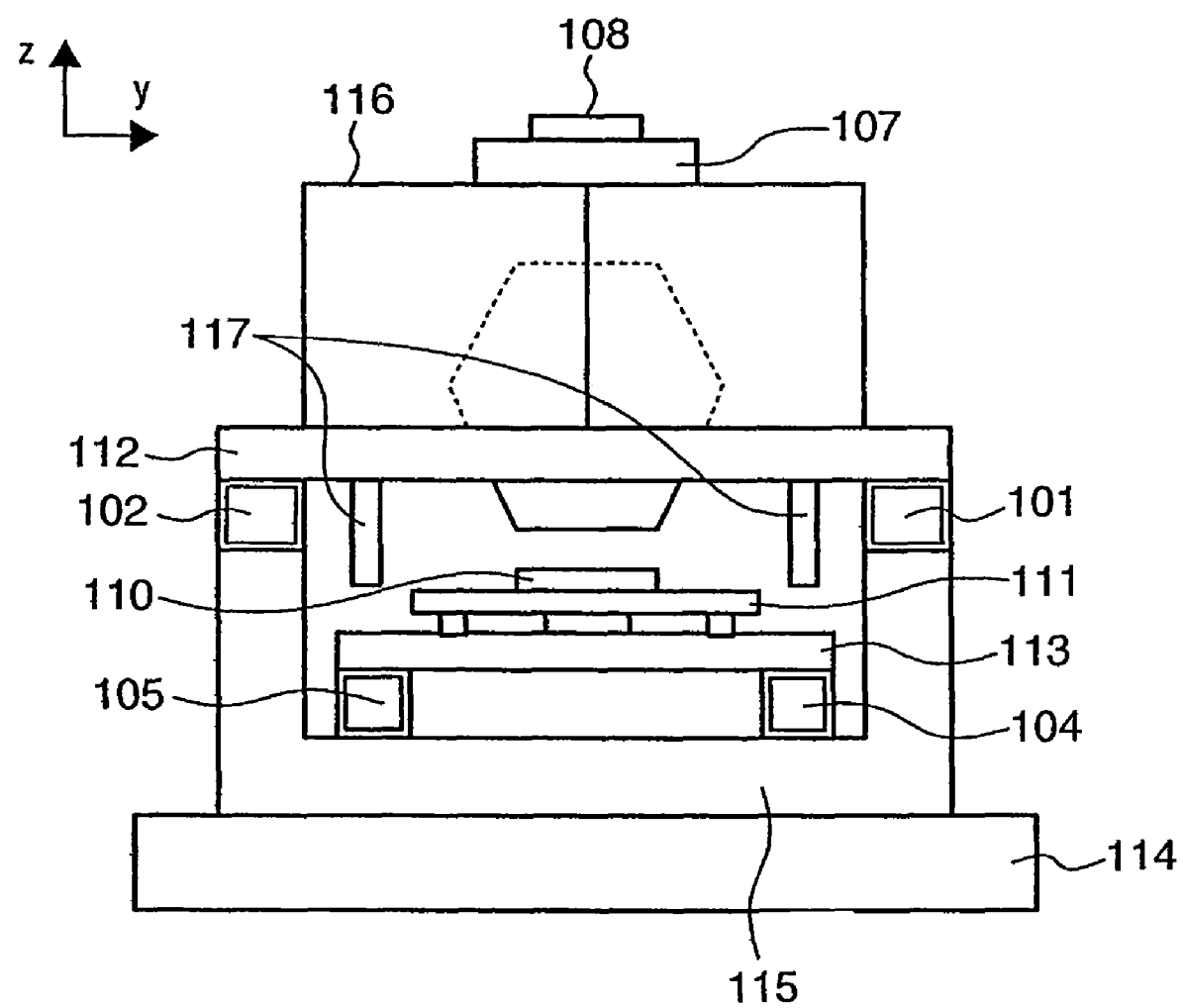
FIG. 7 is a side view of the exposure apparatus according to the preferred embodiment of the present invention.
Figure 8:
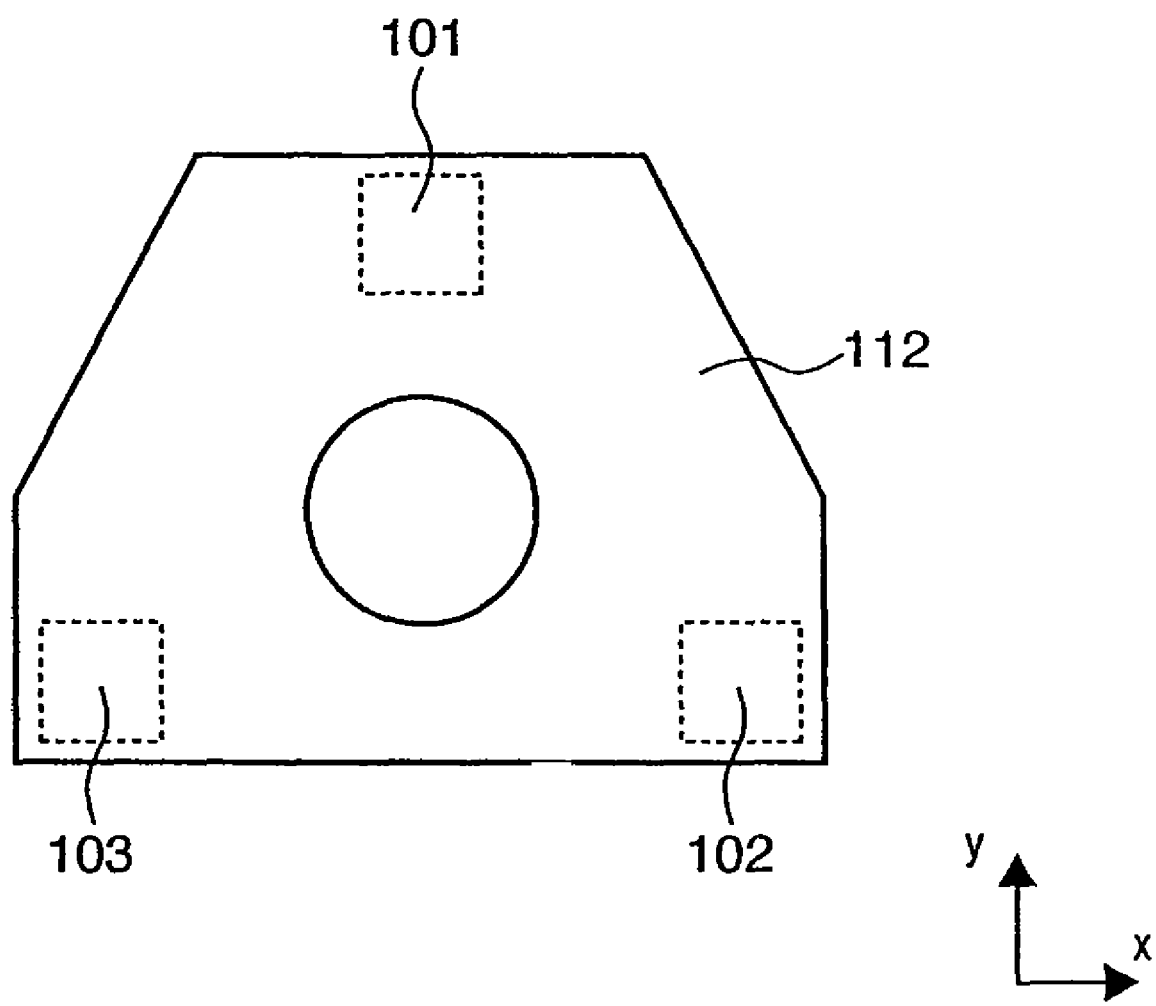
FIG. 8 is a plan view showing a lens barrel base as a first structure.
Figure 9:
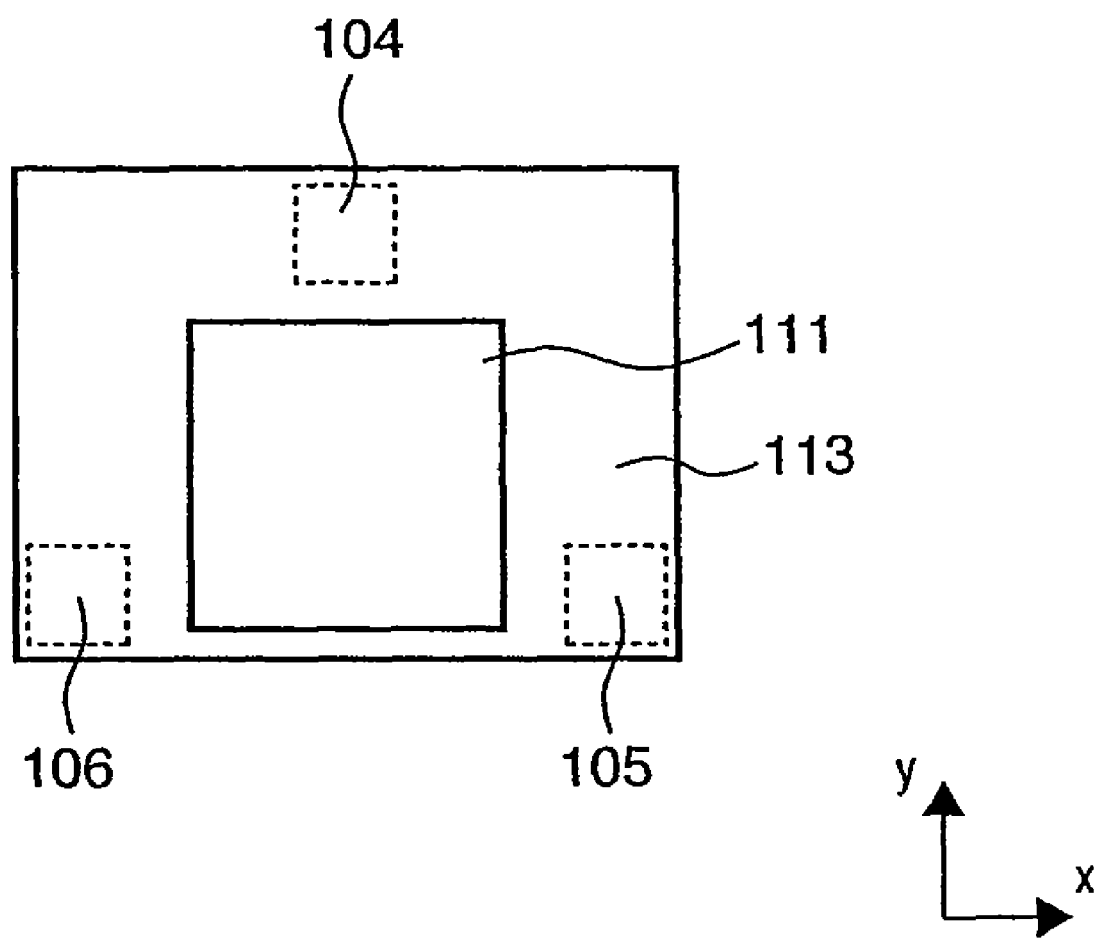
FIG. 9 is a plan view showing a wafer stage base as a second structure.

The schematic structure of an exposure apparatus according to a preferred embodiment of the present invention will be described first with reference to FIGS. 6 to 9. FIG. 6 is a front view of the exposure apparatus. FIG. 7 is a side view of the exposure apparatus. FIG. 8 is a plan view showing a lens barrel base 112 as a first structure on which, e.g., a projection unit (e.g., a reticle stage (original stage) 107 and a projection lens (projection optical system) 109) is mounted. FIG. 9 is a plan view showing a wafer stage base 113 as a second structure on which, e.g., a wafer stage (substrate stage) 111 is mounted.

The exposure apparatus according to the preferred embodiment of the present invention forms, using an exposure beam (a beam such as ultraviolet light, an excimer laser beam, EUV light (extreme ultraviolet light), X-rays, or an electron beam), a latent image pattern on a substrate coated with a photosensitive agent. The exposure apparatus, which transfers the pattern of an original onto a substrate coated with a photosensitive agent, may include, e.g., an original stage and a projection optical system. The original stage aligns the original. The projection optical system projects an exposure beam containing pattern information of the original onto the substrate.

The reticle stage 107 is a constituent component to align a reticle (original) 108 and is movable in, e.g., the Y direction. The wafer stage 111 is a constituent component to align a wafer (substrate) 110 and is movable in, e.g., the X and Y directions. Typically, the wafer stage 111 also has a mechanism to slightly rotate the wafer 110 around the Z-axis and tilt it with respect to the X- and Y-axes.

The state (e.g., position, velocity, or acceleration) of the reticle stage 107 is detected by a first stage state detector, such as a laser interferometer, servo accelerometer, gyro angular speedometer, or eddy current displacement meter. On the basis of the detected information, the reticle stage 107 is given a thrust by a linear motor (first stage actuator) including a magnet and coil to control its state. In general, normally, the magnet is mounted in the reticle stage 107 serving as a movable unit, and the coil is mounted in a body 116. The reticle stage 107 is driven by the first stage actuator relative to the lens barrel base 112 as the first structure. In this specification, the state of a mechanical component, such as the stage or structure, means a state such as a posture, position, velocity, or acceleration, which is expressed by dynamics.

The state (e.g., position, velocity, or acceleration) of the wafer stage 111 is detected by a second stage state detector, such as a laser interferometer, servo accelerometer, gyro angular speedometer, or eddy current displacement meter. On the basis of the detected information, the wafer stage 111 is given a thrust by a linear motor including a magnet and a coil to control its state. In general, normally, the magnet is mounted in the wafer stage 111 serving as a movable unit, and the coil is mounted in the wafer stage base 113. The wafer stage 111 is driven by the second stage actuator relative to the wafer stage base 113 as the second structure.

The lens barrel base 112 is supported by anti-vibration supporting legs 101, 102, and 103. The wafer stage base 113 is supported by anti-vibration supporting legs 104, 105, and 106. Each of the anti-vibration supporting legs 101 to 106 has a vibration insulation function and a vibration suppression function. The vibration insulation function removes vibration from outside of the apparatus, such as an installation floor 114. The vibration suppression function removes vibration acting upon driving the wafer stage 111.

The anti-vibration supporting legs 101, 102, and 103 for the lens barrel base 112 are fixed to a base frame 115. The base frame 115 is installed on the installation floor 114. The anti-vibration supporting leg 101 has an actuator (first actuator), e.g., to give the lens barrel base 112 thrusts in the X and Z directions. Each of the anti-vibration supporting legs 102 and 103 has a necessary number of actuators (first actuators) which, e.g., actuate the lens barrel base 112 in the Y and Z directions.

The anti-vibration supporting legs 104, 105, and 106 for the wafer stage base 113 are also fixed to the base frame 115, like the anti-vibration supporting legs 101, 102, and 103. The anti-vibration supporting leg 104 has an actuator (second actuator), e.g., to give the wafer stage base 113 thrusts in the X and Z directions. Each of the anti-vibration supporting legs 105 and 106 has a necessary number of actuators (second actuators) which, e.g., actuate the wafer stage base 113 in the Y and Z directions.

The state (e.g., position, velocity, or acceleration) of each of the lens barrel base 112 and anti-vibration supporting legs 101, 102, and 103 is detected by a state detector, such as a laser interferometer, a servo accelerometer, a gyro angular speedometer, or an eddy current displacement meter. On the basis of the detected information, the lens barrel base 112 is given a force by the actuator (first actuator) to control the states of the lens barrel base 112 and anti-vibration supporting legs 101, 102, and 103.

The state (e.g., position, velocity, or acceleration), of each of the wafer stage base 113 and anti-vibration supporting legs 104, 105, and 106, is detected by a state detector, such as a laser interferometer, a servo accelerometer, a gyro angular speedometer, or an eddy current displacement meter. On the basis of the detected information, the wafer stage base 113 is given a thrust by the actuator (second actuator) to control the states of the stage base 113 and anti-vibration supporting legs 104, 105, and 106.

Each of the actuators of the anti-vibration supporting legs 101 to 106 may include, e.g., a fluid actuator and an electromagnetic driving linear motor. Preferably, the fluid actuator is, e.g., an air actuator, which controls the internal pressure of an air spring by a valve, which adjusts air supply/exhaustion thereto/therefrom. Although the air actuator can relatively easily generate a thrust large enough to support the weight of the base, it is unsuitable for control of vibration suppression in a high-frequency region or control of a very small force. On the other hand, the linear motor attains control in a frequency band wider than that by the air actuator, but it can hardly generate a large thrust. For this reason, as described above, a linear motor and an air actuator are preferably used together. If a linear motor is formed to have a so-called VCM (Voice Coil Motor) structure, and a coil and a permanent magnet are incorporated in an air actuator, this design makes it possible to realize a small-sized anti-vibration supporting leg.

Referring to FIG. 7, a relative displacement detector 117 detects the relative displacement between the lens barrel base 112 and the wafer stage base 113, and may include, e.g., an eddy current displacement meter and/or a laser interferometer.

Figure 1:
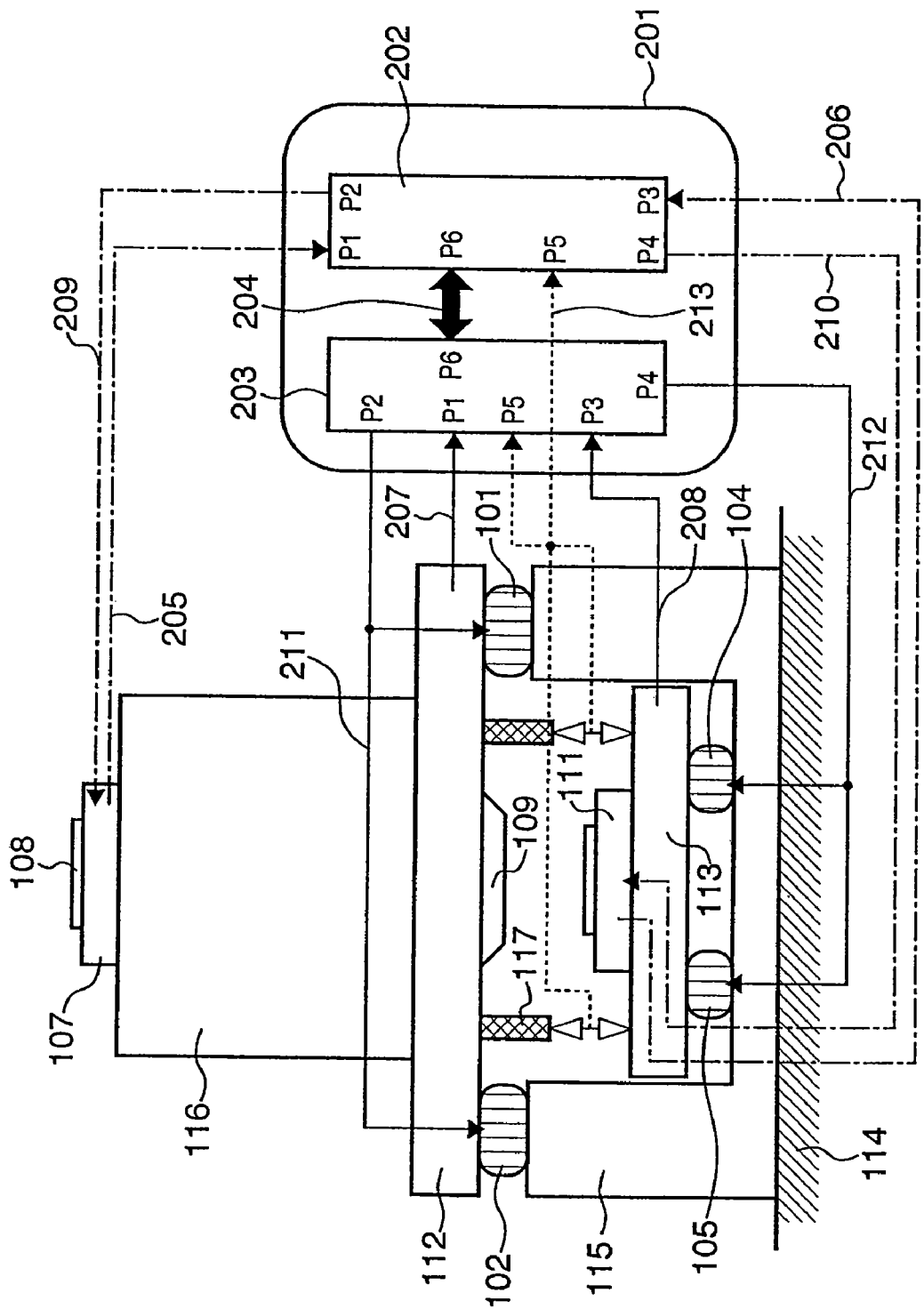
FIG. 1 is a view showing a main control system of stages and anti-vibration supporting legs according to a preferred embodiment of the present invention.

FIG. 1 is a view showing a main control system of stages and anti-vibration supporting legs according to the preferred embodiment of the present invention. Referring to FIG. 1, a control operation device (control device) 201 comprises a stage control operation unit 202 and an anti-vibration supporting leg control operation unit 203. The stage control operation unit 202 executes an arithmetic operation to control the state (e.g., position, velocity, or acceleration) of the reticle stage 107, an arithmetic operation to control the state (e.g., position, velocity, or acceleration) of the wafer stage 111, and an arithmetic operation to synchronously control the reticle stage 107 and wafer stage 111.

The state of the reticle stage 107 is controlled by the stage control operation unit 202. More specifically, the stage control operation unit 202 receives, at its port P1, a control signal 205 sent from the first stage state detector, which detects the state of the reticle stage 107. The stage control operation unit 202 compares the control signal 205 with the state target of the reticle stage 107 to calculate the manipulated variable of the reticle stage 107. The stage control operation unit 202 sends a control signal 209 from its port P2 to the first stage actuator of the reticle stage 107, thereby controlling the state of the reticle stage 107.

The state of the wafer stage 111 is also controlled by the stage control operation unit 202. More specifically, the stage control operation unit 202 receives, at its port P3, a control signal 206 sent from the second stage state detector, which detects the state of the wafer stage 111. The stage control operation unit 202 compares the control signal 206 with the state target of the wafer stage 111, to calculate the manipulated variable of the wafer stage 111. The stage control operation unit 202 sends a control signal 210 from its port P4 to the second stage actuator of the wafer stage 111, thereby controlling the state of the wafer stage 111.

Synchronous control of a reticle stage and a wafer stage is disclosed in, e.g., Japanese Patent Laid-Open Nos. 7-29801, 8-241126, and 9-26828.

Three examples of the synchronous control method for the reticle stage 107 and wafer stage 111 will be given. In the first method, the stage control operation unit 202 calculates the manipulated variable of the wafer stage 111 using the control signal of the reticle stage 107. The stage control operation unit 202 sends the control signal 210 from its port P4 to the second stage actuator of the wafer stage 111, thereby synchronizing the wafer stage 111 with the reticle stage 107. In the second method, the stage control operation unit 202 calculates the manipulated variable of the reticle stage 107 using the control signal of the wafer stage 111. The stage control operation unit 202 sends the control signal 209 from its port P2 to the first stage actuator of the reticle stage 107, thereby synchronizing the reticle stage 107 with the wafer stage 111. In the third method, the stage control operation unit 202 calculates the manipulated variables of the reticle stage 107 and wafer stage 111 using the control signals of the reticle stage 107 and wafer stage 111. The stage control operation unit 202 sends the control signal 210 from its port P4 to the second stage actuator of the wafer stage 111, and additionally, sends the control signal 209 from its port P2 to the first stage actuator of the reticle stage 107, thereby synchronizing the wafer stage 111 with the reticle stage 107.

Referring to FIG. 1, the anti-vibration supporting leg control operation unit 203 executes an arithmetic operation to control the states (e.g., positions, velocities, or accelerations) of the lens barrel base 112 and anti-vibration supporting legs 101, 102, and 103, an arithmetic operation to control the states (e.g., positions, velocities, or accelerations) of the wafer stage base 113 and anti-vibration supporting legs 104, 105, and 106, an arithmetic operation to synchronously control the lens barrel base 112 and wafer stage base 113, and an arithmetic operation to control the relative displacement (inter base relative displacement) between the lens barrel base 112 and the wafer stage base 113.

The states of the lens barrel base 112 and anti-vibration supporting legs 101, 102, and 103 are controlled by the anti-vibration supporting leg control operation unit 203. More specifically, the anti-vibration supporting leg control operation unit 203 receives, at its port P1, a control signal 207 sent from the state detector, which detects the state of each of the lens barrel base 112 and anti-vibration supporting legs 101, 102, and 103. The anti-vibration supporting leg control operation unit 203 compares the control signal 207 with the state target to calculate the manipulated variables of the anti-vibration supporting legs 101, 102, and 103. The anti-vibration supporting leg control operation unit 203 sends control signals 211 from its port P2 to the first actuators of the anti-vibration supporting legs 101, 102, and 103, thereby, controlling the states of the lens barrel base 112 and anti-vibration supporting legs 101, 102, and 103.

The states of the wafer stage base 113 and anti-vibration supporting legs 104, 105, and 106 are also controlled by the anti-vibration supporting leg control operation unit 203. More specifically, the anti-vibration supporting leg control operation unit 203 receives, at its port P3, a control signal 208 sent from the state detector, which detects the state of each of the wafer stage base 113 and anti-vibration supporting legs 104, 105, and 106. The anti-vibration supporting leg control operation unit 203 compares the control signal 208 with the state target to calculate the manipulated variables of the anti-vibration supporting legs 104, 105, and 106. The anti-vibration supporting leg control operation unit 203 sends control signals 212 from its port P4 to the second actuators of the anti-vibration supporting legs 104, 105, and 106, thereby controlling the states of the wafer stage base 113 and anti-vibration supporting legs 104, 105, and 106.

Various methods are available even for synchronous control of the lens barrel base 112 and wafer stage base 113, like those for synchronous control of the reticle stage 107 and wafer stage 111.

For example, the anti-vibration supporting leg control operation unit 203 calculates the manipulated variables of the anti-vibration supporting legs 101 to 106 using the control signals of the anti-vibration supporting legs 101 to 106. The anti-vibration supporting leg control operation unit 203 sends the control signals 212 from its port P4 to the second actuators of the anti-vibration supporting legs 104, 105, and 106, and, additionally, sends the control signals 211 from its port P2 to the first actuators of the anti-vibration supporting legs 101, 102, and 103, thus synchronizing the lens barrel base 112 with the wafer stage base 113.

The relative displacement (inter base relative displacement) between the lens barrel base 112 and the wafer stage base 113 is controlled in the following way. That is, the anti-vibration supporting leg control operation unit 203 calculates the manipulated variables of the anti-vibration supporting legs 101 to 106 on the basis of a control signal 213 sent from the relative displacement detector 117, which detects the relative displacement between the lens barrel base 112 and the wafer stage base 113. The anti-vibration supporting leg control operation unit 203 sends the control signals 211 from its port P2 to the first actuators of the anti-vibration supporting legs 101, 102, and 103, and additionally, sends the control signals 212 from its port P4 to the second actuators of the anti-vibration supporting legs 104, 105, and 106.

The relative displacement detector 117 may detect the relative displacement between the lens barrel base 112 and the wafer stage base 113. Alternatively, the relative displacement detector 117 may detect the relative displacement between the lens barrel base 112 and the wafer stage 111. In the latter case, the exposure apparatus comprises a relative displacement detector, which detects the relative displacement between the lens barrel base 112 and the wafer stage 111, and a relative displacement detector, which detects the relative displacement between the wafer stage 111 and the wafer stage base 113. The exposure apparatus causes the control operation device 201 to receive signals output from the two relative displacement detectors and to calculate the relative displacement between the lens barrel base 112 and the wafer stage base 113. Sending control signals to the actuators of the anti-vibration supporting legs 101 to 106 makes it possible to control (reduce) the relative displacement between the lens barrel base 112 and the wafer stage base 113.

Referring to FIG. 1, the ports P6 of the stage control operation unit 202 and anti-vibration supporting leg control operation unit 203 can be used to exchange signals with each other for their driving reaction force reception control.

Figure 2:
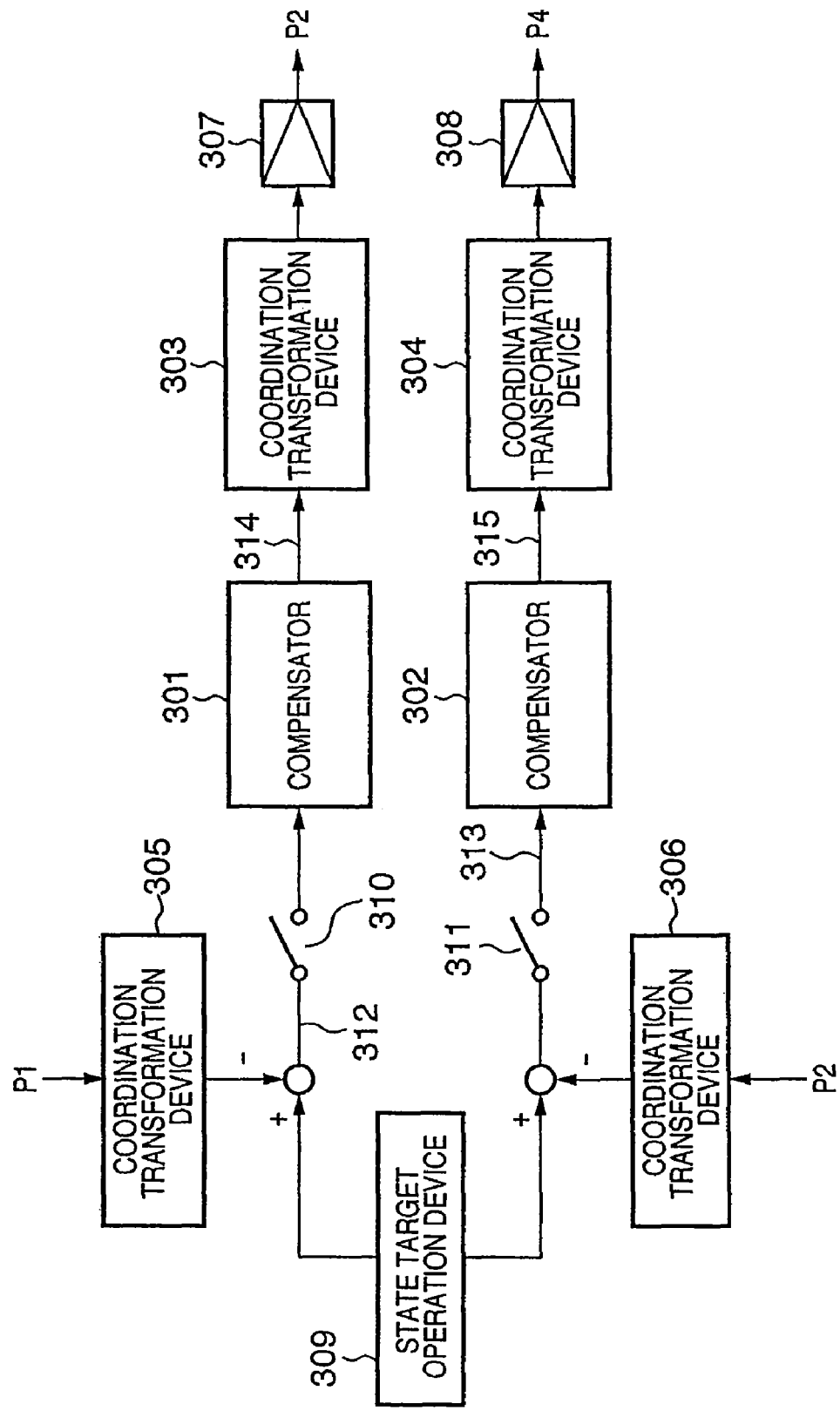
FIG. 2 is a diagram showing an arrangement example as a comparative example of a stage control operation unit and an anti-vibration supporting leg control operation unit.

FIG. 2 is a diagram showing an arrangement example as a comparative example of the stage control operation unit 202 and anti-vibration supporting leg control operation unit 203.

Referring to FIG. 2, a control operation processing system for the state (e.g., position, velocity, or acceleration) of the reticle stage 107 or lens barrel base 112 in the stage control operation unit 202 or anti-vibration supporting leg control operation unit 203 causes a coordinate transformation device 305 to execute coordinate transformation of the control signal 205 or 207 received at the port P1 into those along a control axis. In accordance with a control signal 312 serving as a difference signal between a signal output from the coordinate transformation device 305 and a signal output from a state target operation device 309, which generates the state target (e.g., driving target position, driving target velocity, or driving target acceleration) of the reticle stage 107 or lens barrel base 112, a compensator 301 (e.g., a PI or PID compensator, integrator, or amplifier) generates a control signal 314 indicating the manipulated variable of the reticle stage 107 or lens barrel base 112 along the control axis. A coordinate transformation device 303 transforms the control signal 314 into a control signal along the axis of each actuator. A power amplifier 307 changes the transformed signal into an appropriate control signal of each actuator. The stage control operation unit 202 or anti-vibration supporting leg control operation unit 203 outputs the obtained signal from its port P2 as the control signal 209 or control signal 211.

A control operation processing system for the state (e.g., position, velocity, or acceleration) of the wafer stage 111 or wafer stage base 113 in the stage control operation unit 202 or anti-vibration supporting leg control operation unit 203 causes a coordinate transformation device 306 to execute coordinate transformation of the control signal 206 or 208 received at the port P3 into one along a control axis. In accordance with a control signal 313 serving as a difference signal between a signal output from the coordinate transformation device 306 and a signal output from the state target operation device 309, which generates the state target (e.g., driving target position, driving target velocity, or driving target acceleration) of the wafer stage 111 or wafer stage base 113, a compensator 302 (e.g., a PI or PID compensator, integrator, or amplifier) generates a control signal 315 indicating the manipulated variable of the wafer stage 111 or wafer stage base 113 along the control axis. A coordinate transformation device 304 transforms the control signal 315 into a control signal along the axis of each actuator. A power amplifier changes the transformed signal into an appropriate control signal of each actuator. The stage control operation unit 202 or anti-vibration supporting leg control operation unit 203 outputs the obtained signal from its port P4 as the control signal 210 or control signal 212.

Referring to FIG. 2, a switch 310 is used to power on/off the state control operation processing systems of the reticle stage 107 and lens barrel base 112. When the switch 310 is set to be OFF, the reticle stage 107 and lens barrel base 112 are subjected to synchronous control and inter base relative displacement control alone. A switch 311 is used to power on/off the state control operation processing systems of the wafer stage 111 and wafer stage base 113. When the switch 311 is set to be OFF, the wafer stage 111 and wafer stage base 113 are subjected to synchronous control and inter-base relative displacement control alone.

Figure 3:
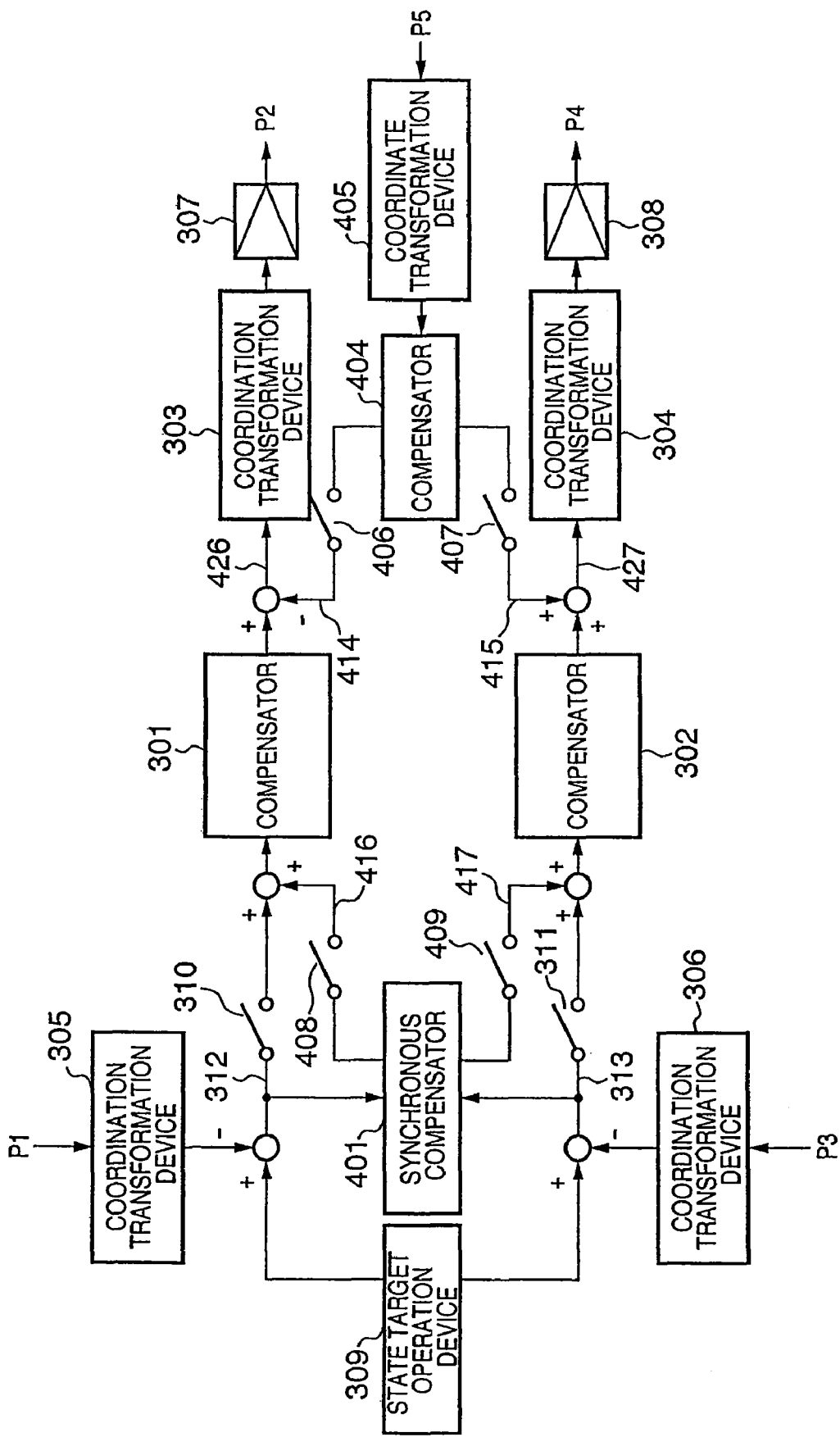
FIG. 3 is a diagram showing the first arrangement example of the stage control operation unit and an anti-vibration supporting leg control operation unit.
Figure 4:
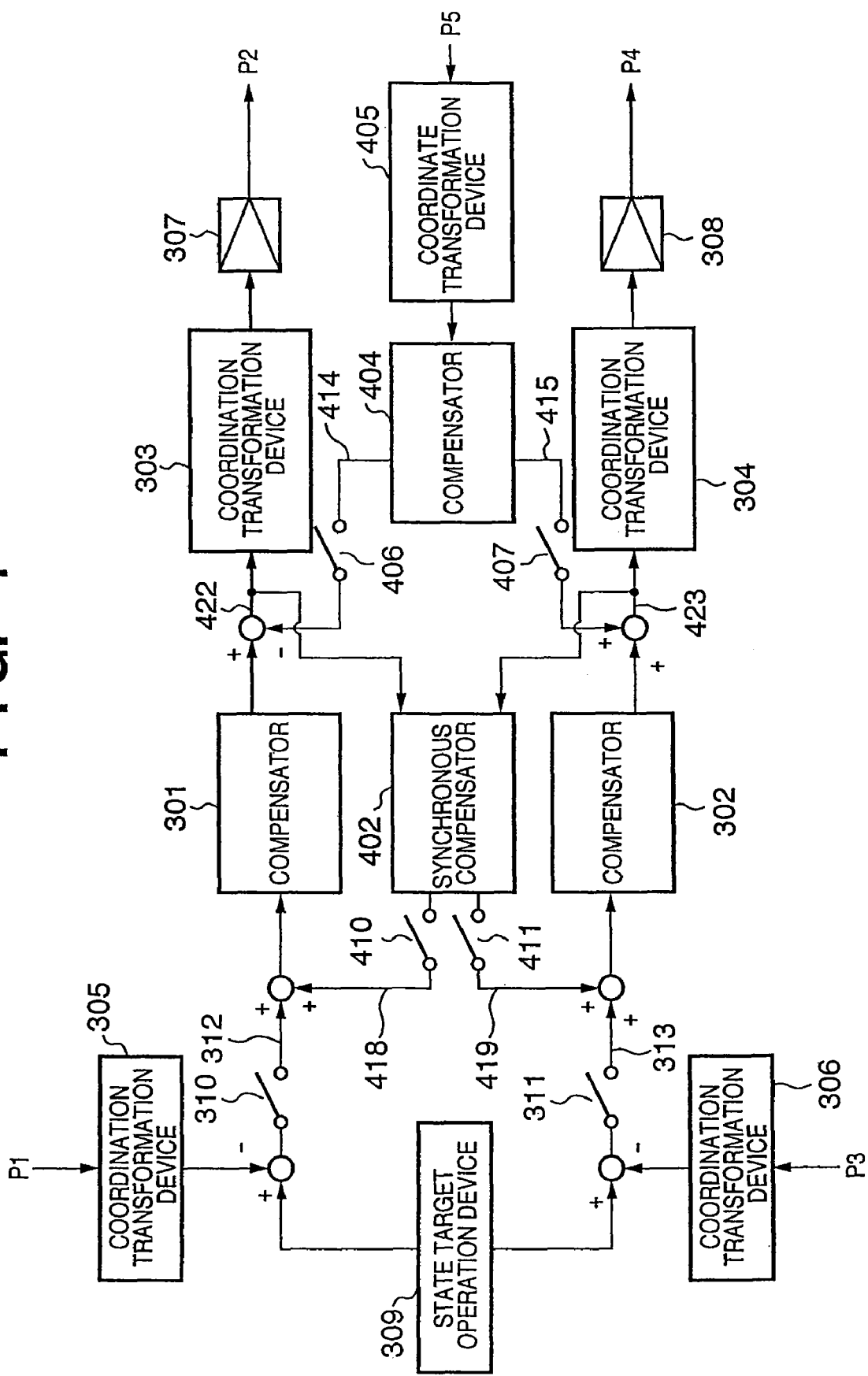
FIG. 4 is a diagram showing the second arrangement example of the stage control operation unit and an anti-vibration supporting leg control operation unit.
Figure 5:
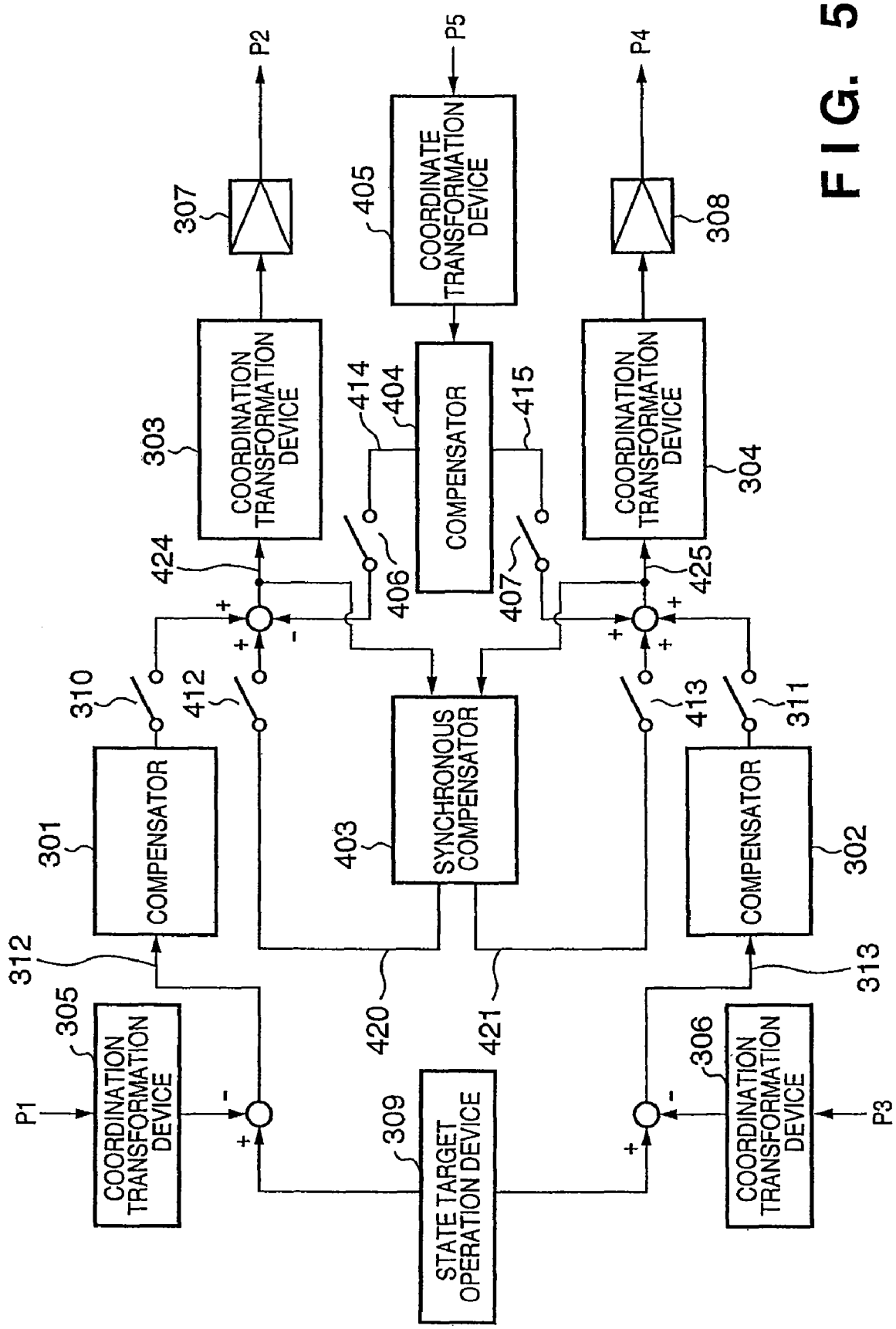
FIG. 5 is a diagram showing the third arrangement example of the stage control operation unit and an anti-vibration supporting leg control operation unit.

FIGS. 3 to 5 are diagrams showing the first to third arrangement examples of the stage control operation unit 202 and anti-vibration supporting leg control operation unit 203 according to the preferred embodiment of the present invention. The first arrangement example shown in FIG. 3 is available for synchronous control in the following way. That is, a deviation signal (synchronous deviation signal) between the reticle stage 107 and the wafer stage 111 is corrected using itself. Alternatively, a deviation signal (synchronous deviation signal) between the lens barrel base 112 and the wafer stage base 113 is corrected using itself. The second arrangement example shown in FIG. 4 is available for synchronous control in the following way. That is, a deviation signal (synchronous deviation signal) between the reticle stage 107 and the wafer stage 111 is corrected using actuating signals of the reticle stage 107 and wafer stage 111. Alternatively, a deviation signal (synchronous deviation signal) between the lens barrel base 112 and the wafer stage base 113 is corrected using actuating signals of the lens barrel base 112 and wafer stage base 113. The third arrangement example shown in FIG. 5 is available for synchronous control in the following way. That is, actuating signals of the reticle stage 107 and wafer stage 111 are corrected using themselves. Alternatively, actuating signals of the lens barrel base 112 and wafer stage base 113 are corrected using themselves.

Synchronous control of the reticle stage 107 and wafer stage 111 according to the preferred embodiment of the present invention will be exemplified below with reference to FIGS. 3 to 5.

Three examples associated with synchronous control in the first arrangement example shown in FIG. 3 will be given. In the first example, both switches 408 and 409 are set to be ON to cause a synchronous compensator 401 to generate, on the basis of control signals 312 and 313, control signals 416 and 417, which respectively serve as correction signals of the control signals 312 and 313. The synchronous compensator 401 adds the control signals 416 and 417 to the control signals 312 and 313, respectively. In the second example, the switch 408 is set to be ON and the switch 409 is set to be OFF, to cause the synchronous compensator 401 to generate, on the basis of a control signal 313, a control signal 416 serving as a correction signal of a control signal 312. The synchronous compensator 401 adds the control signal 416 to the control signal 312. In the third example, the switch 408 is set to be OFF and the switch 409 is set to be ON, to cause the synchronous compensator 401 to generate, on the basis of a control signal 312, a control signal 417 serving as a correction signal of a control signal 313. The synchronous compensator 401 adds the control signal 417 to the control signal 313.

Three examples associated with synchronous control in the second arrangement example shown in FIG. 4 will be given. In the first example, both switches 410 and 411 are set to be ON, to cause a synchronous compensator 402 to generate, on the basis of control signals 422 and 423, control signals 418 and 419, which respectively serve as correction signals of control signals 312 and 313. The control signal 422 serves as a signal input to the coordinate transformation device 303 and also serves as a control axis-specific actuating signal for the reticle stage 107. The control signal 423 serves as a signal input to the coordinate transformation device 304 and also serves as a control axis-specific actuating signal for the wafer stage 111. The synchronous compensator 402 adds the control signals 418 and 419 to the control signals 312 and 313, respectively. In the second example, the switch 410 is set to be ON and the switch 411 is set to be OFF, to cause the synchronous compensator 402 to generate, on the basis of a control signal 423, serving as a signal input to the coordinate transformation device 304, a control signal 418, serving as a correction signal of a control signal 312. The synchronous compensator 402 adds the control signal 418 to the control signal 312. In the third example, the switch 410 is set to be OFF and the switch 411 is set to be ON, to cause the synchronous compensator 402 to generate, on the basis of a control signal 422, serving as a signal input to the coordinate transformation device 303, a control signal 419, serving as a correction signal of a control signal 313. The synchronous compensator 402 adds the control signal 419 to the control signal 313.

Three examples associated with synchronous control in the third arrangement example shown in FIG. 5 will be given. In the first example, both switches 412 and 413 are set to be ON, to cause a synchronous compensator 403 to generate, on the basis of control signals 424 and 425, control signals 420 and 421, which respectively serve as correction signals of the control signals 424 and 425. The control signal 424 serves as a signal input to the coordinate transformation device 303 and also serves as a control axis-specific actuating signal for the reticle stage 107. The control signal 425 serves as a signal input to the coordinate transformation device 304 and also serves as a control axis-specific actuating signal for the wafer stage 111. The synchronous compensator 403 adds the control signals 420 and 421 to the control signals 424 and 425, respectively. In the second example, the switch 412 is set to be ON and the switch 413 is set to be OFF, to cause the synchronous compensator 403 to generate, on the basis of a control signal 425, serving as a signal input to the coordinate transformation device 304, the control signal 420, serving as a correction signal of a control signal 424. The synchronous compensator 403 adds the control signal 420 to the control signal 424. In the third example, the switch 412 is set to be OFF and the switch 413 is set to be ON, to cause the synchronous compensator 403 to generate, on the basis of a control signal 424, serving as a signal input to the coordinate transformation device 303, a control signal 421, serving as a correction signal of a control signal 425. The synchronous compensator 403 adds the control signal 421 to the control signal 425.

Synchronous control (relative position deviation reduction control) of the lens barrel base 112 and wafer stage base 113, according to the preferred embodiment of the present invention, will be exemplified next, with reference to FIGS. 3 to 5.

In the first arrangement example shown in FIG. 3, both the switches 408 and 409 are set to be ON, to cause the synchronous compensator 401 to generate, on the basis of the control signals 312 and 313, the control signals 416 and 417, which respectively serve as the correction signals of the control signals 312 and 313. The synchronous compensator 401 adds the control signals 416 and 417 to the control signals 312 and 313, respectively.

In the second arrangement example shown in FIG. 4, both the switches 410 and 411 are set to be ON, to cause the synchronous compensator 402 to generate, on the basis of the control signals 422 and 423, the control signals 418 and 419, which respectively serve as the correction signals of the control signals 312 and 313. The control signal 422 serves as the signal input to the coordinate transformation device 303 and also serves as the control axis-specific actuating signal for the reticle stage 107 or lens barrel base 112. The control signal 423 serves as the signal input to the coordinate transformation device 304 and also serves as the control axis-specific actuating signal for the wafer stage 111 or wafer stage base 113. The synchronous compensator 402 adds the control signals 418 and 419 to the control signals 312 and 313, respectively.

In the third arrangement example shown in FIG. 5, both the switches 412 and 413 are set to be ON, to cause the synchronous compensator 403 to generate, on the basis of the control signals 424 and 425, the control signals 420 and 421, which respectively serve as the correction signals of the control signals 424 and 425. The control signal 424 serves as the signal input to the coordinate transformation device 303 and also serves as the control axis-specific actuating signal for the reticle stage 107 or lens barrel base 112. The control signal 425 serves as the signal input to the coordinate transformation device 304 and also serves as the control axis-specific actuating signal for the wafer stage 111 or wafer stage base 113. The synchronous compensator 403 adds the control signals 420 and 421 to the control signals 424 and 425, respectively.

In the arrangement examples shown in FIGS. 3 to 5, a control arithmetic operation process of the relative displacement (inter-base relative displacement) between the lens barrel base 112 and the wafer stage base 113 is executed by the anti-vibration supporting leg control operation unit 203, in the following way. That is, both switches 406 and 407 are set to be ON, to cause a coordinate transformation device 405 to transform a relative displacement signal for the lens barrel base 112 or the wafer stage base 113, which serves as a signal input from a port P5, into a control axis specific relative displacement signal for the lens barrel base 112 or wafer stage base 113. On the basis of the relative displacement signal for each control axis, a compensator 404 generates control signals 414 and 415. The control signal 414 serves as a correction signal of a control signal 422, 424 or 426, serving as a signal input to the coordinate transformation device 303. The control signal 415 serves as a correction signal of a control signal 423, 425, or 427, serving as a signal input to the coordinate transformation device 304. The compensator 404 adds/subtracts the control signal 414 and 415 to/from the signal input to the coordinate transformation device 303 and 304, respectively.

If inter base relative displacement control is to be executed by the lens barrel base 112 alone, the switch 406 may be set to be ON, and the switch 407 may be set to be OFF. If inter-base relative displacement control is to be executed by the wafer stage base 113 alone, the switch 412 may be set to be OFF, and the switch 413 may be set to be ON. When inter base relative displacement control is to be cut off, both the switches 406 and 407 may be set to be OFF.

Each of the reticle stage 107, wafer stage 111, lens barrel base 112, and wafer stage base 113 only need to have one or more state detectors. However, six or more state detectors are preferably arranged so as to calculate by coordinate transformation movement along three axes of a rectangular coordinate system and in three rotation axes around the three axes of the rectangular coordinate system.

Each of the reticle stage 107, wafer stage 111, lens barrel base 112, and wafer stage base 113 only need to have one or more actuators to give forces thereto. However, six or more actuators are preferably arranged so as to enable movement with six degrees of freedom, i.e., movement along three axes of a rectangular coordinate system and in three rotation axes around the three axes of the rectangular coordinate system.

Preferably, the system of each control axis is a coordinate system of six axes, i.e., three axes of a rectangular coordinate system, having a coordinate origin that is common to all the control axes of the reticle stage 107, wafer stage 111, lens barrel base 112, and wafer stage base 113, and three rotation axes around the three axes of the rectangular coordinate system.

Although it suffices as long as one or more relative displacement detectors 204 are prepared, attainable driving amounts of the reticle stage 107 and wafer stage 111 along their rotation axes are generally much smaller than attainable driving amounts along their horizontal axes. For this reason, three relative displacement detectors 204 to detect the relative displacement between the lens barrel base 112 and the wafer stage base 113 along their vertical axes are preferably arranged to execute inter-base relative displacement control associated with tilting by the anti-vibration supporting leg control operation unit 203.

Second Embodiment

The second embodiment of the present invention may follow the first embodiment, except for synchronous control of a lens barrel base 112 and wafer stage base 113.

In the second embodiment, an anti-vibration supporting leg control operation unit 203 calculates the manipulated variables of anti-vibration supporting legs 101, 102, and 103 using control signals of anti-vibration supporting legs 104, 105, and 106. A stage control operation unit 202 sends a control signal 211 from its port P2 to an actuator (first actuator) of each of the anti-vibration supporting legs 101, 102, and 103, thereby synchronizing the lens barrel base 112 with the wafer stage base 113.

In the first arrangement example shown in FIG. 3, a switch 408 is set to be ON and a switch 409 is set to be OFF, to cause a synchronous compensator 401 to generate, on the basis of a control signal 313, a control signal 416 serving as a correction signal of a control signal 312. The synchronous compensator 401 adds the control signal 416 to the control signal 312.

In the second arrangement example shown in FIG. 4, a switch 410 is set to be ON and a switch 411 is set to be OFF to cause a synchronous compensator 402 to generate, on the basis of a control signal 423, serving as a signal input to a coordinate transformation device 304, a control signal 418, serving as a correction signal of the control signal 312. The synchronous compensator 402 adds the control signal 418 to the control signal 312.

In the third arrangement example shown in FIG. 5, a switch 412 is set to be ON and a switch 413 is set to be OFF, to cause a synchronous compensator 403 to generate, on the basis of a control signal 425, serving as a signal input to the coordinate transformation device 304, a control signal 420, serving as a correction signal of a control signal 424. The synchronous compensator 403 adds the control signal 420 to the control signal 424.

Third Embodiment

The third embodiment of the present invention may follow the first embodiment, except for synchronous control of a lens barrel base 112 and wafer stage base 113.

In the third embodiment, an anti-vibration supporting leg control operation unit 203 calculates the manipulated variables of anti-vibration supporting legs 104, 105, and 106 using control signals of anti-vibration supporting legs 101, 102, and 103. An anti-vibration supporting leg control operation unit 203 sends a control signal 212 from its port P4 to an actuator (second actuator) of each of the anti-vibration supporting legs 104, 105, and 106, thereby, synchronizing the lens barrel base 112 with the wafer stage base 113.

In the first arrangement example shown in FIG. 3, a switch 408 is set to be OFF and a switch 409 is set to be ON, to cause a synchronous compensator 401 to generate, on the basis of a control signal 312, a control signal 417, serving as a correction signal of a control signal 313. The synchronous compensator 401 adds the control signal 417 to the control signal 313.

In the second arrangement example shown in FIG. 4, a switch 410 is set to OFF and a switch 411 is set to ON, to cause a synchronous compensator 402 to generate, on the basis of a control signal 422 serving as a signal input to a coordinate transformation device 303, a control signal 419 serving as a correction signal of the control signal 313. The synchronous compensator 402 adds the control signal 419 to the control signal 313.

In the third arrangement example shown in FIG. 5, a switch 412 is set to OFF and a switch 413 is set to ON, to cause a synchronous compensator 403 to generate, on the basis of a control signal 424, serving as a signal input to the coordinate transformation device 303, a control signal 421, serving as a correction signal of a control signal 425. The synchronous compensator 403 adds the control signal 421 to the control signal 425.

EFFECTS

Figure 10:
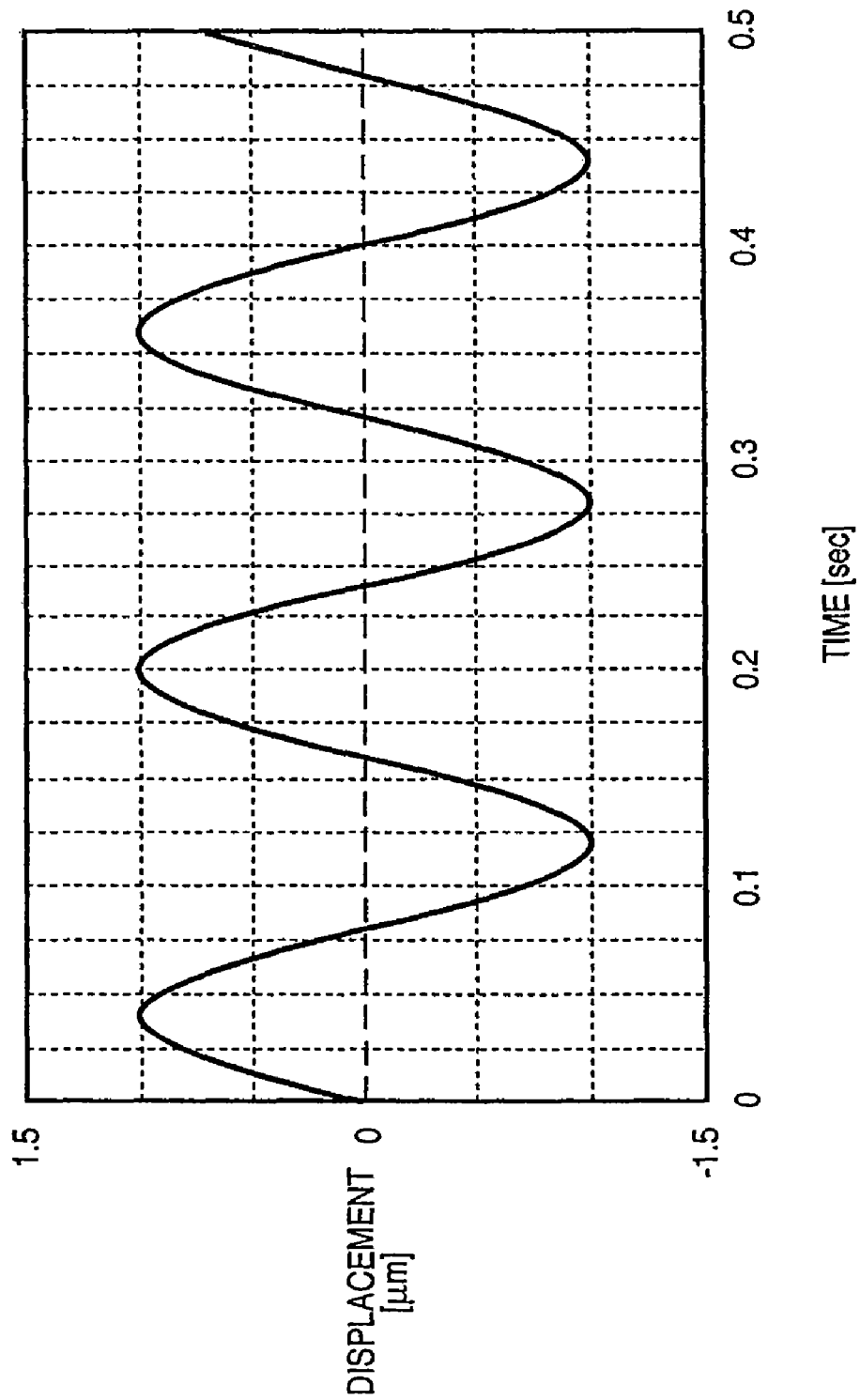
FIG. 10 is a graph showing a temporal change in displacement as the first structure vibrates with a single frequency (sine wave) of 6.25 Hz.
Figure 11:
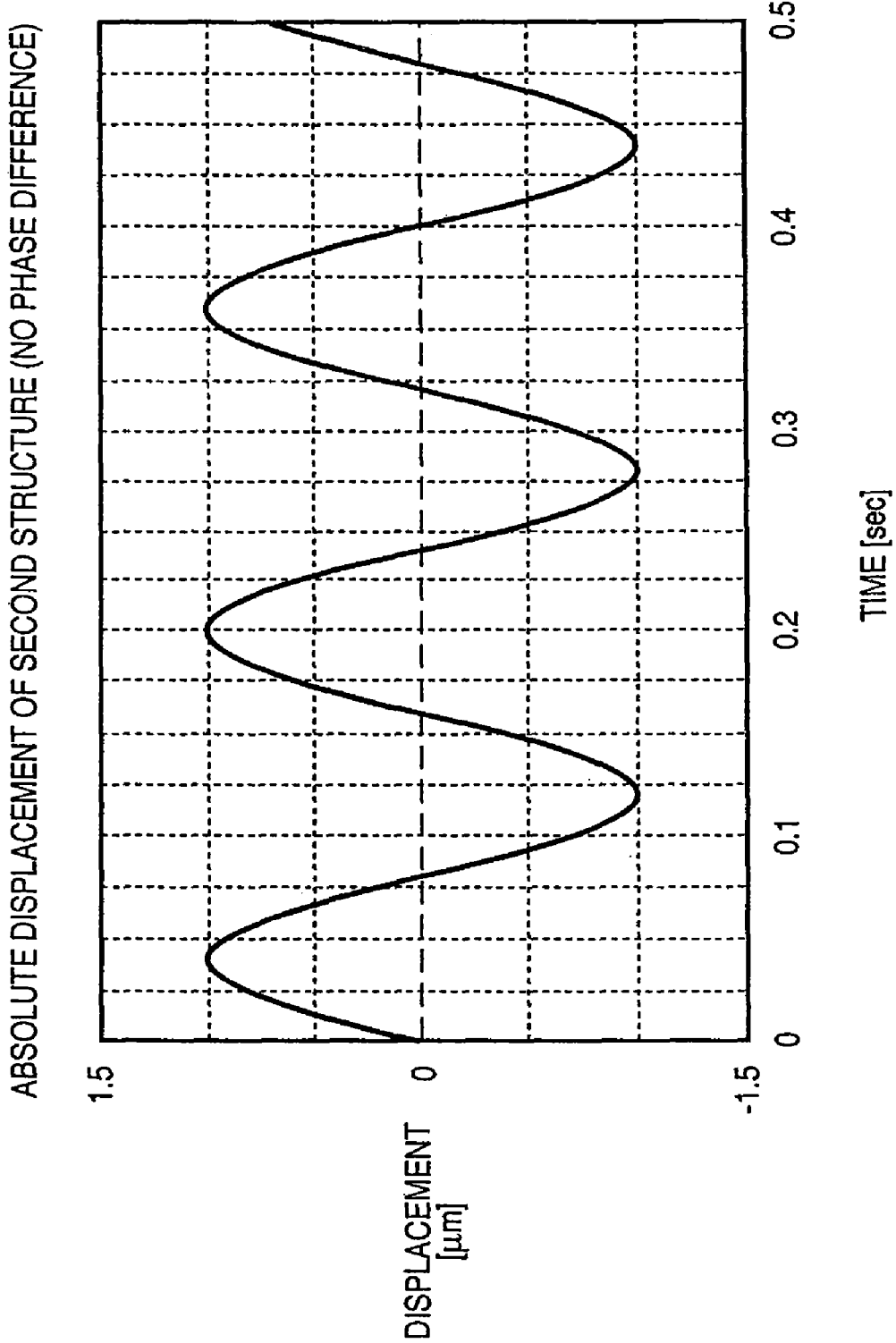
FIG. 11 is a graph showing a temporal change in displacement as the second structure vibrates with a single frequency (sine wave) of 6.25 Hz without a phase difference from vibration of the first structure.
Figure 12:
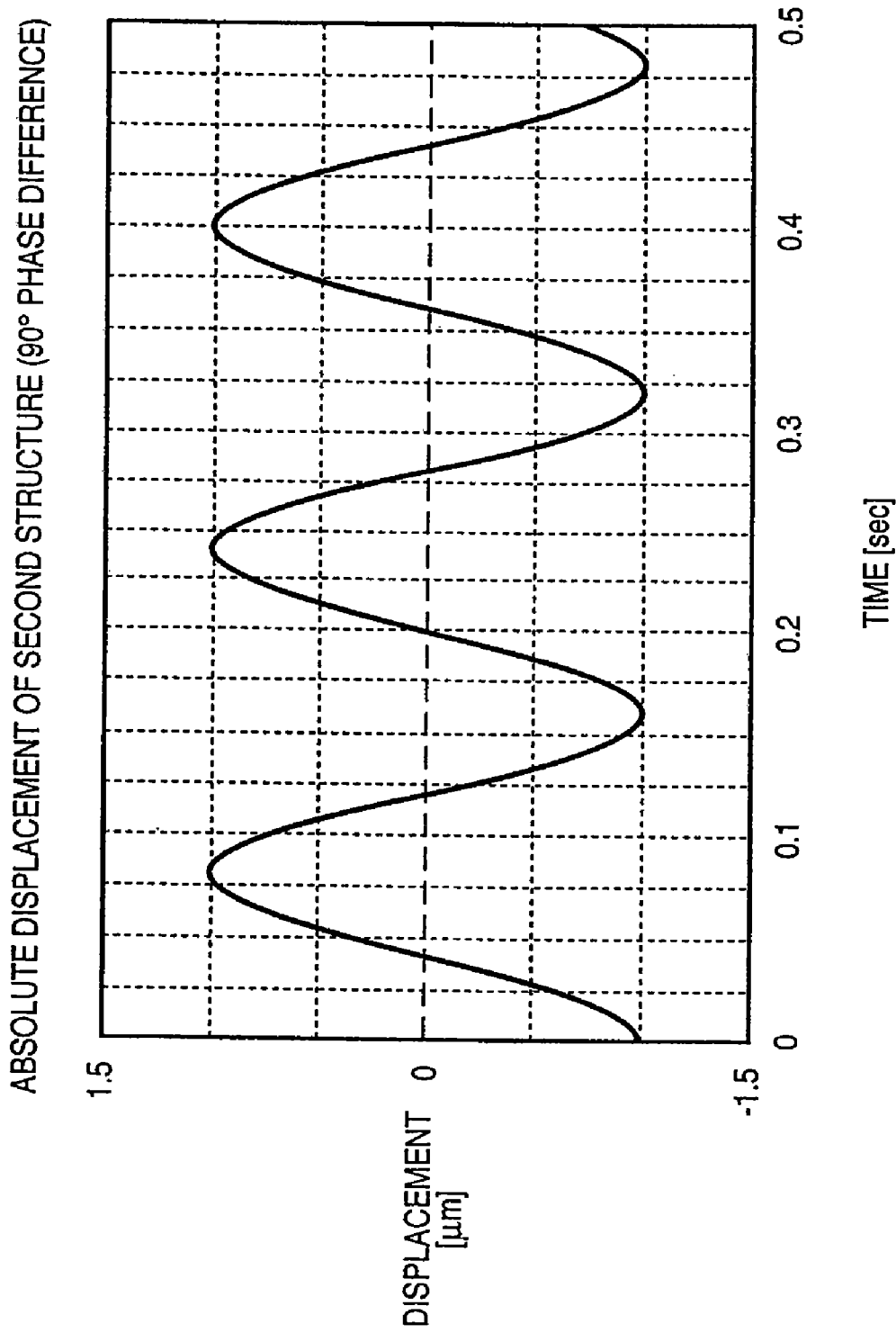
FIG. 12 is a graph showing a temporal change in displacement as the second structure vibrates with a single frequency of 6.25 Hz, with a phase delay of 90° with respect to vibration of the first structure.
Figure 13:
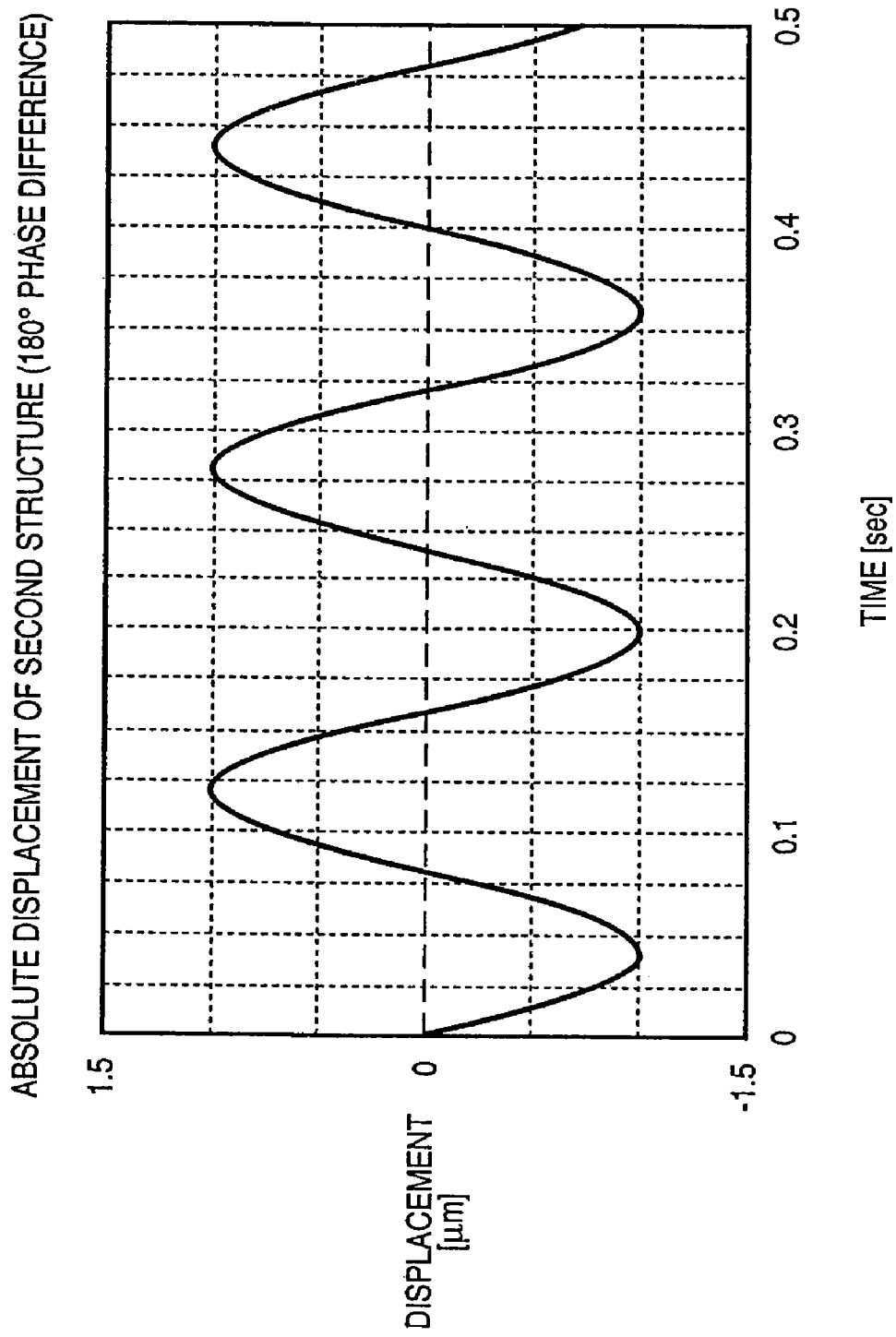
FIG. 13 is a graph showing a temporal change in displacement as the second structure vibrates with a single frequency of 6.25 Hz, with a phase delay of 180° with respect to vibration of the first structure.
Figure 14:
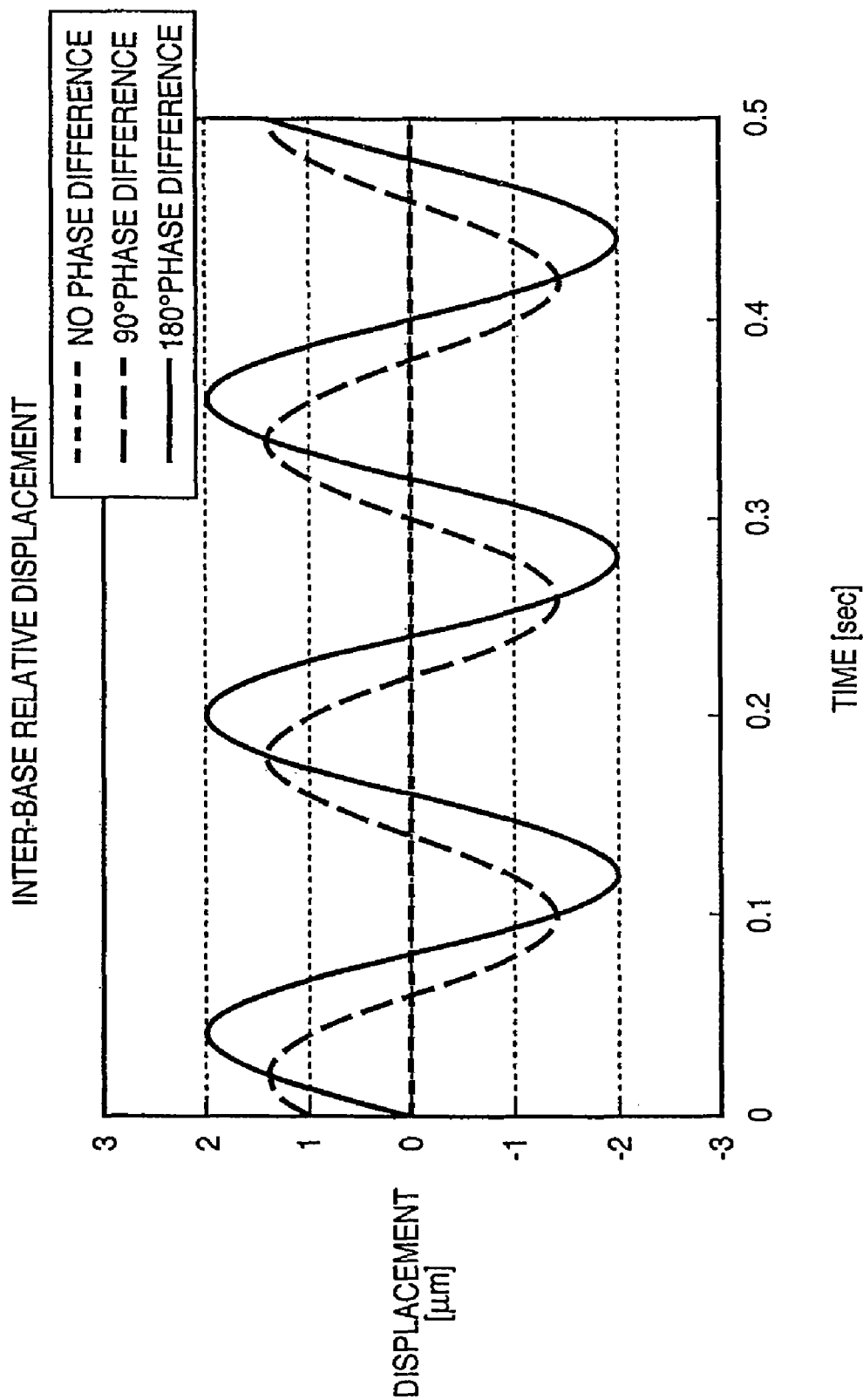
FIG. 14 is a graph showing the relative displacement between the first and second structures when the two structures vibrate, as shown in FIGS. 11 to 13.

FIGS. 10 to 14 are graphs simply showing an example of effects by a control operation to which the present invention is applied, and show temporal changes in displacement of respective structures. FIG. 10 shows a temporal change in displacement as a first structure vibrates with a single frequency (sine wave) of 6.25 Hz. FIG. 11 shows a temporal change in displacement as a second structure vibrates with a single frequency of 6.25 Hz, without a phase difference from vibration of the first structure. FIG. 12 shows a temporal change in displacement as a second structure vibrates with a single frequency of 6.25 Hz, and a phase delay of 90° with respect to vibration of the first structure. FIG. 13 shows a temporal change in displacement as a second structure vibrates with a single frequency of 6.25 Hz, and a phase delay of 180° with respect to vibration of the first structure. FIG. 14 shows the relative displacement between the first and second structures when the two structures vibrate as shown in FIGS. 11 to 13.

Referring to FIG. 14, while the first structure vibrates with a single frequency (sine wave) of 6.25 Hz and an amplitude of 1 [μm], the second structure vibrates with the same frequency (sine wave) and amplitude as those of the first structure, but with a phase delay. In this case, as the phase delay amount gets closer from 0° to 180° (broken line→alternate long and short dashed line→solid line), the amplitude of a relative displacement waveform between the first and second structures increases. When vibrations of the first and second structures are completely synchronized, the relative displacement between these structures becomes zero, as indicated by the broken line.

Application Example

Device Manufacturing Method

Figure 15:
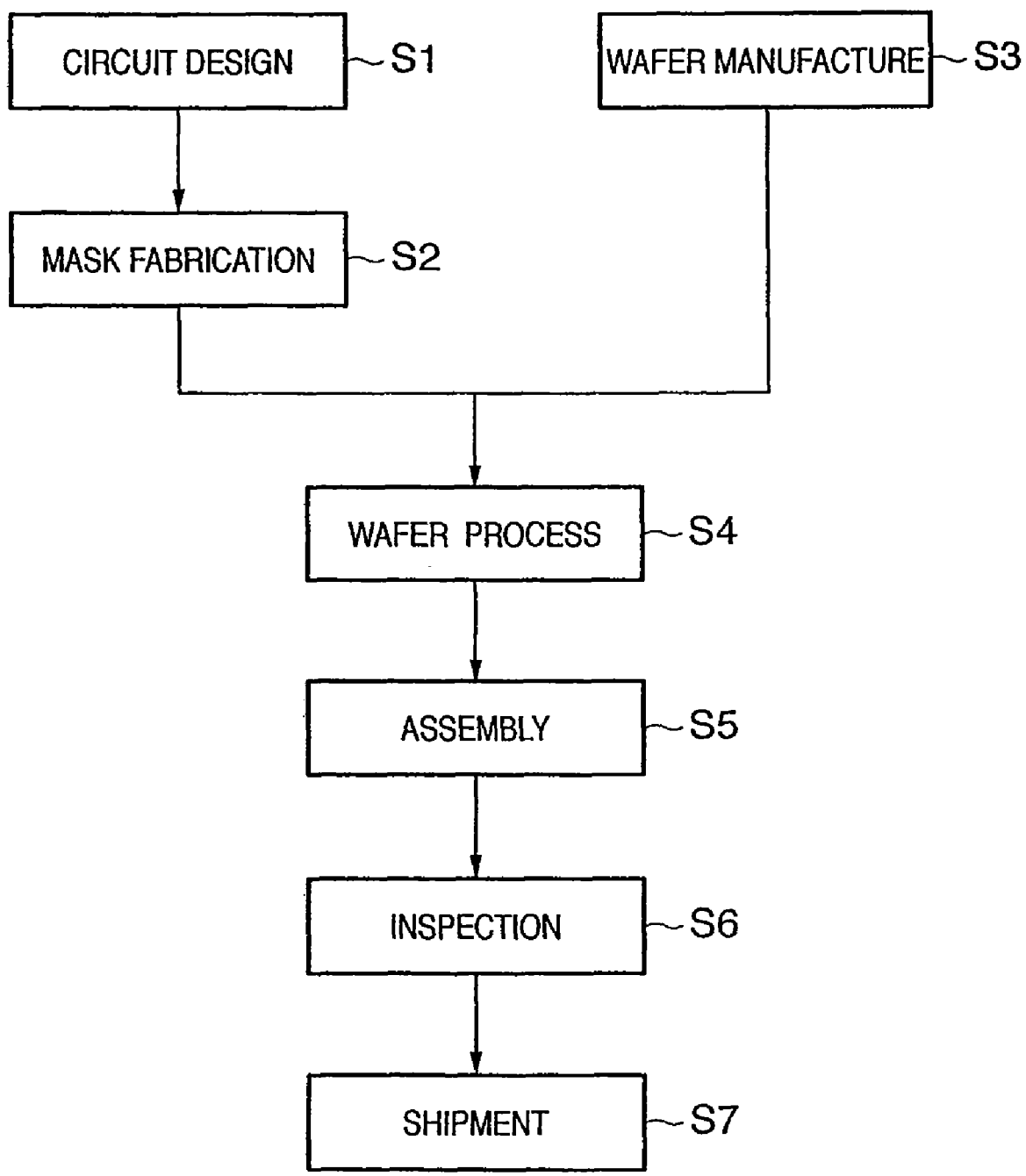
FIG. 15 is a flowchart showing the flow of the overall semiconductor device manufacturing process.

A semiconductor device manufacturing process using the above-described exposure apparatus will be described next. FIG. 15 is a flowchart showing the flow of the overall semiconductor device manufacturing process. In step S1 (circuit design), the circuit of a semiconductor device is designed. In step S2 (mask fabrication), a mask is fabricated on the basis of the designed circuit pattern. In step S3 (wafer manufacture), a wafer is manufactured using a material such as silicon. In step S4 (wafer process), called a pre-process, an actual circuit is formed on the wafer by lithography using the mask and wafer. In step S5 (assembly), called a post process, a semiconductor chip is formed using the wafer manufactured in step S4. This step includes an assembly step (dicing and bonding) and a packaging step (chip encapsulation). In step S6 (inspection), the semiconductor device manufactured in step S5 undergoes inspections, such as an operation confirmation test and a durability test. After these steps, the semiconductor device is completed and shipped (step S7).

Figure 16:
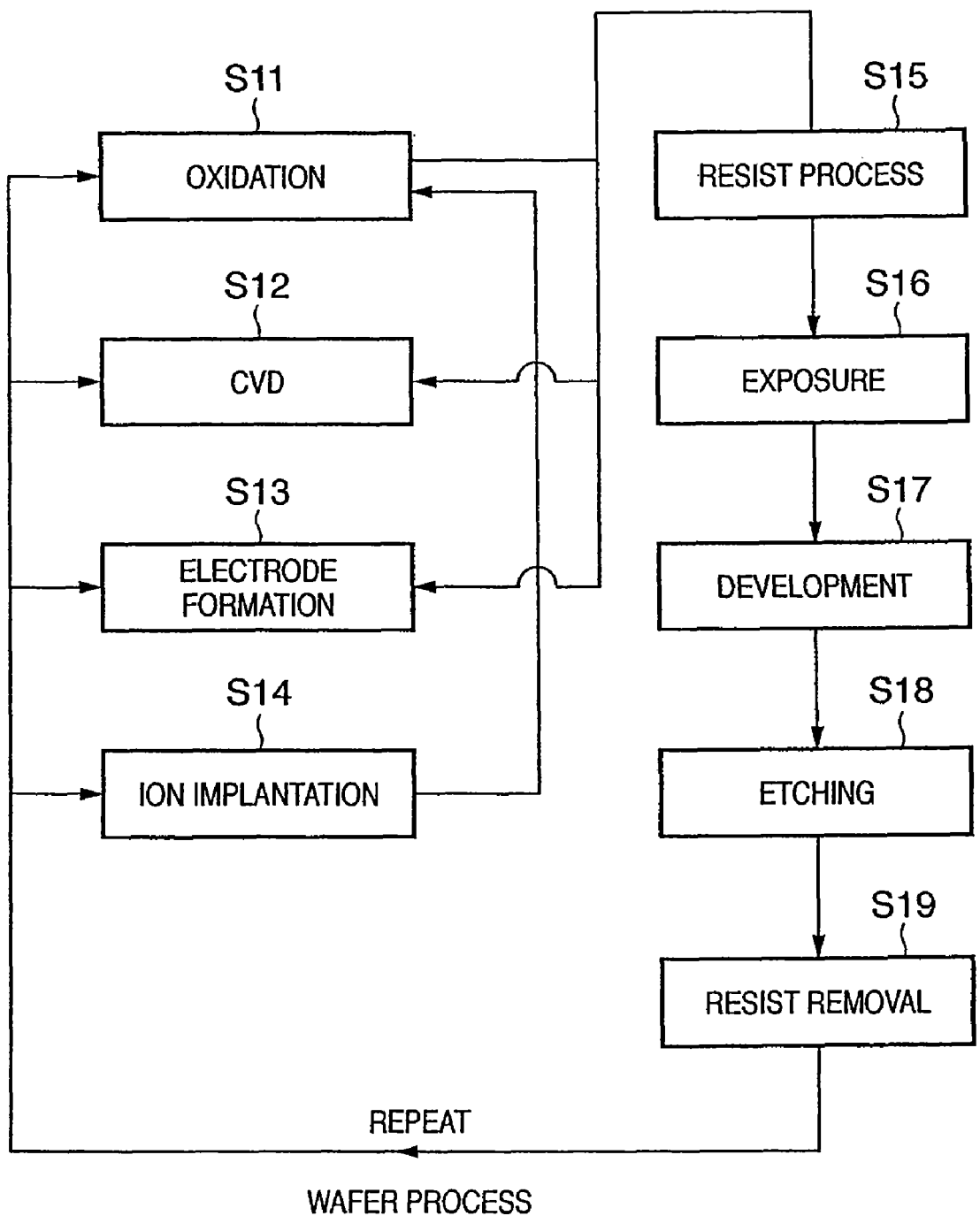
FIG. 16 is a flowchart showing the detailed flow of the wafer process.

FIG. 16 is a flowchart showing the detailed flow of the wafer process. In step S11 (oxidation), the wafer surface is oxidized. In step S12 (CVD), an insulating film is formed on the wafer surface. In step S13 (electrode formation), an electrode is formed on the wafer by vapor deposition. In step S14 (ion implantation), ions are implanted in the wafer. In step S15 (resist process), a photosensitive agent is applied to the wafer. In step S16 (exposure), the above-described exposure apparatus is caused to transfer the circuit pattern onto the wafer coated with the photosensitive agent to form a latent image pattern. In step S17 (development), the latent image pattern transferred onto the wafer is developed to form a resist pattern. In step S18 (etching), portions other than the developed resist image are etched. In step S19 (resist removal), any unnecessary resist remaining after etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus which forms a latent image pattern on a substrate using an exposure beam, said apparatus comprising:
   a first structure which supports a projection unit which projects an exposure beam onto a substrate;
   a first supporting leg which includes a first actuator and supports said first structure;
   a first state detector which detects a state of said first structure;
   a second structure which supports a substrate stage which aligns the substrate;
   a second supporting leg which includes a second actuator and supports said second structure;
   a second state detector which detects a state of said second structure;
   a compensator which generates a correction signal for synchronizing said first structure and said second structure with each other based on at least one of a first signal in accordance with a signal from said first state detector and a first target signal and a second signal in accordance with a signal from said second state detector and a second target signal; and
   a switch which selects one of operations including (i) an operation in which the correction signal is added to only a signal for controlling said first actuator, (ii) an operation in which the correction signal is added to only a signal for controlling said second actuator, and (iii) an operation in which the correction signal is added to both the signal for controlling said first actuator and the signal for controlling said second actuator.

2. The apparatus according to claim 1, wherein the first and second signals are one of a manipulated variable and a control signal.

3. The apparatus according to claim 1, wherein the signal for controlling said first actuator and the signal for controlling said second actuator are one of a manipulated variable and a control signal.

* * * * *